United States Patent
Zhang et al.

(10) Patent No.: US 10,698,053 B2
(45) Date of Patent: Jun. 30, 2020

(54) SYSTEM AND METHOD FOR GRADIENT-MODULATED SWEEP IMAGING WITH FOURIER TRANSFORMATION MAGNETIC RESONANCE IMAGING

(71) Applicants: Jinjin Zhang, Minneapolis, MN (US); Michael Garwood, Minneapolis, MN (US); Djaudat Idiyatullin, Minneapolis, MN (US); Curt Corum, Minneapolis, MN (US); Naoharu Kobayashi, Minneapolis, MN (US)

(72) Inventors: Jinjin Zhang, Minneapolis, MN (US); Michael Garwood, Minneapolis, MN (US); Djaudat Idiyatullin, Minneapolis, MN (US); Curt Corum, Minneapolis, MN (US); Naoharu Kobayashi, Minneapolis, MN (US)

(73) Assignee: Regents of the University of Minnesota, Minneapolis, MN (US)

( * ) Notice: Subject to any disclaimer, the term of this patent is extended or adjusted under 35 U.S.C. 154(b) by 540 days.

(21) Appl. No.: 14/617,616

(22) Filed: Feb. 9, 2015

(65) Prior Publication Data
US 2015/0226821 A1    Aug. 13, 2015

Related U.S. Application Data

(60) Provisional application No. 61/974,163, filed on Apr. 2, 2014, provisional application No. 61/937,458, filed on Feb. 7, 2014.

(51) Int. Cl.
*G01V 3/00* (2006.01)
*G01R 33/48* (2006.01)

(52) U.S. Cl.
CPC .................. *G01R 33/4816* (2013.01)

(58) Field of Classification Search
CPC ............ G01R 33/5608; G01R 33/4835; G01R 33/4828; G01R 33/543; A61B 5/055
(Continued)

(56) References Cited

U.S. PATENT DOCUMENTS

| 7,403,006 | B2 | 7/2008 | Garwood |
| 2005/0016276 | A1* | 1/2005 | Guan ............... G01N 29/022 73/579 |

(Continued)

OTHER PUBLICATIONS

Blümich, B. "Stochastic NMR imaging." Journal of Magnetic Resonance (1969) 60.1 (1984): 37-45.
(Continued)

*Primary Examiner* — Walter L Lindsay, Jr.
*Assistant Examiner* — Frederick Wenderoth
(74) *Attorney, Agent, or Firm* — Quarles & Brady LLP (57) ABSTRACT

Described here are systems and methods for magnetic resonance imaging ("MRI") using a sweeping frequency excitation applied during a time-varying magnetic field gradient. As an example, a gradient-modulated offset independent adiabaticity ("GOIA") approach can be used to modify the pattern of the sweeping frequency excitation. Data are acquired as time domain signals and processed to generate images. As an example, the time domain signals are processed using a correlation between a Fourier transform of the gradient-modulated sweeping frequency excitation and a Fourier transform of the time domain signals.

14 Claims, 5 Drawing Sheets

(58) Field of Classification Search
USPC .......................................................... 324/309
See application file for complete search history.

(56) References Cited

U.S. PATENT DOCUMENTS

| | | | |
|---|---|---|---|
| 2012/0146639 A1* | 6/2012 | Sorensen | G01R 33/4633 324/309 |
| 2013/0249550 A1* | 9/2013 | Feiweier | G01R 33/563 324/309 |
| 2014/0035580 A1* | 2/2014 | Andronesi | G01R 33/36 324/309 |
| 2014/0167754 A1* | 6/2014 | Jerecic | G01R 33/56 324/309 |

OTHER PUBLICATIONS

Conolly, S, et al. "Variable-rate selective excitation." Journal of Magnetic Resonance (1969) 78.3 (1988): 440-458.
Garwood, M, et al. "Capturing signals from fast-relaxing spins with frequency-swept MRI: SWIFT." eMagRes (2007).
Garwood, M. "MRI of fast-relaxing spins." Journal of magnetic resonance 229 (2013): 49-54.
Kobayashi, N, et al. "B1 mapping of short T2* spins using a 3D radial gradient echo sequence." Magnetic resonance in medicine 71.5 (2014): 1689-1699.
Powell, N. J., et al. "Gradient rotating outer volume excitation (Groove): A novel method for single-shot two-dimensional outer volume suppression." Magnetic resonance in medicine 73.1 (2015): 139-149.
Tannús, A et al. "Adiabatic pulses." NMR in Biomedicine: An International Journal Devoted to the Development and Application of Magnetic Resonance In Vivo 10.8 (1997): 423-434.

* cited by examiner

SYSTEM AND METHOD FOR GRADIENT-MODULATED SWEEP IMAGING WITH FOURIER TRANSFORMATION MAGNETIC RESONANCE IMAGING

CROSS-REFERENCE TO RELATED APPLICATIONS

This application claims the benefit of U.S. Provisional Patent Application Ser. No. 61/937,458, filed on Feb. 7, 2014, and entitled "SYSTEM AND METHOD FOR GRADIENT-MODULATED SWEEP IMAGING WITH FOURIER TRANSFORMATION MAGNETIC RESONANCE IMAGING," and claims the benefit of U.S. Provisional Patent Application Ser. No. 61/974,163, filed on Apr. 2, 2014, and entitled, "SYSTEM AND METHOD FOR GRADIENT-MODULATED SWEEP IMAGING WITH FOURIER TRANSFORMATION MAGNETIC RESONANCE IMAGING," both of which are incorporated herein in their entirety.

STATEMENT REGARDING FEDERALLY SPONSORED RESEARCH

This invention was made with government support under RR008079 awarded by the National Institutes of Health. The government has certain rights in the invention.

BACKGROUND OF THE INVENTION

The field of the invention is systems and methods for magnetic resonance imaging ("MRI"). More particularly, the invention relates to systems and methods for gradient-modulated sweep imaging with Fourier transformation ("GM-SWIFT") MRI.

In conventional MRI sequences, the time elapsing between spin excitation and signal acquisition, which is known as the echo time ("TE"), is typically too long to detect nuclei with short transverse relaxation times ("$T_2$") or effective transverse relaxation times ("$T_2^*$"). This is problematic for imaging highly ordered tissues (e.g., tendons and knee meniscus) and highly mineralized tissues (e.g., bone, teeth).

Short $T_2^*$ sensitive sequences like ultra-short echo time ("UTE"), back-projection low angle shot ("BLAST"), and rotating ultra-fast imaging sequence ("RUFIS") have been developed to detect signals from ultra-short $T_2^*$ spins. In addition to these sequences, a new type of pulse sequence called sweep imaging with Fourier transformation ("SWIFT") was introduced.

SWIFT uses swept radio frequency ("RF") excitation and virtually simultaneous signal acquisition in a time-shared mode. It provides the ability to capture signal with ultra-short $T_2^*$ in the microsecond range, and has already found several applications. On the other hand, the deposition of specific absorption rate ("SAR") becomes a serious concern with increasing field strength, especially during imaging of fast relaxing spins, which usually require a high excitation bandwidth ("BW"). This creates even more problems for experiments using big volume and potentially power-inefficient RF coils.

There remains a need for a method for magnetic resonance imaging that provides the ability to acquire ultra-short $T_2^*$ signals while reducing SAR, especially at higher field strengths.

SUMMARY OF THE INVENTION

The present invention overcomes the aforementioned drawbacks by providing a method for producing an image of a subject with a magnetic resonance imaging ("MRI") system by directing the MRI system to perform a pulse sequence that includes applying a sweeping frequency excitation having a duration, applying a time-varying magnetic field gradient during the duration, and acquiring a time domain signal during the duration. The sweeping frequency excitation is configured to sequentially excite spins having different resonance frequencies, and the time-varying magnetic field is configured to impart a different phase accumulation to spins having different resonance frequencies. The acquired time domain signals are based on evolution of the spins, such as magnetization evolution of the spins. An image is then produced from the acquired time domain signal. As an example, the image can be produced, in part, by computing a correlation between a Fourier transform of a gradient-modulated sweeping frequency excitation and a Fourier transform of the time domain signal.

The foregoing and other aspects and advantages of the invention will appear from the following description. In the description, reference is made to the accompanying drawings that form a part hereof, and in which there is shown by way of illustration a preferred embodiment of the invention. Such embodiment does not necessarily represent the full scope of the invention, however, and reference is made therefore to the claims and herein for interpreting the scope of the invention.

DETAILED DESCRIPTION OF THE INVENTION

Described here are systems and methods for acquiring magnetic resonance imaging ("MRI") data using a frequency swept excitation played out during a time-varying magnetic field gradient in order to acquire magnetic resonance data as a time domain signal. In some embodiments, the gradient-modulated frequency swept excitation can also be implemented in other measurement and imaging techniques, including nuclear magnetic resonance spectroscopy, electron paramagnetic resonance ("EPR"), nuclear quadrupole resonance ("NQR"), and others. The systems and methods described here are thus useful not only for medical imaging applications, but also for application in dentistry, material science, security, and other industrial applications. The frequency swept excitation method may be used in studies of fast relaxing spins as well as in MRI when using inhomogeneous magnets or imaging inhomogeneous fields.

As an example, the systems and methods described here can implement a frequency swept excitation technique referred to as sweep imaging with Fourier transformation ("SWIFT") and described in U.S. Pat. No. 7,403,006, which is herein incorporated by reference in its entirety. The techniques described here can thus be referred to as gradient-modulated SWIFT ("GW-SWIFT"). This method significantly increases the flexibility of the SWIFT sequence and allows, for example, RF power reduction and increased effective acquisition bandwidth. For instance, GM-SWIFT uses highly reduced specific absorption rate ("SAR") and RF power. As an example, SAR can be reduced by up to ninety percent, and RF power can be reduced up to seventy percent, compared to traditional SWIFT. GM-SWIFT is also capable of suppressing the non-informative, unresolvable ultrashort $T_2$ signal, which is usually responsible for artifacts, such as haloing, in images acquired with a SWIFT technique. GM-SWIFT can also reduce scan time relative to a similar SWIFT acquisition. As an example, GM-SWIFT can reduce scan time up to forty percent with an RF-fraction of 0.125.

A frequency swept excitation is achieved by exciting nuclear spins using a radio frequency ("RF") sweep. In some embodiments, the RF excitation includes a series of pulses, each pulse having an excitation segment and a quiescent segment. The frequency or phase is then swept within each of these pulses. A signal is acquired as a time domain signal during the quiescent segment of each pulse. The acquired signal is treated as a signal that varies as a function of time and is processed in the time domain. After signal acquisition, the signal is processed, for example using a correlation method or a convolution, to correct the acquired signal by separating the spin system spectrum. The processed signal can then be used to reconstruct an image of the underlying object or subject. Generally, the method provides for fast and quiet MRI. Standard MRI scanners, such as those described below, may be programmed to use the frequency swept excitation technique.

In some embodiments, the frequency swept excitation uses a time shared acquisition by incorporating an excitation segment and a quiescent segment during the RF sweep, such that excitation and acquisition are performed nearly simultaneous. In other embodiments, the frequency swept excitation performs excitation and acquisition simultaneously, for example by decoupling the receiver and transmitter.

As mentioned above, the systems and methods described here include performing a frequency swept excitation during the application of a time-varying magnetic field gradient. In standard SWIFT, the accumulated phase of spins depends on the phase of the RF excitation pulse in the moment of excitation, and on the time of evolution in the presence of a constant encoding gradient. As a result, an image can be reconstructed by retrieving the spin density by correlation of the RF pulse function and the signal response in the frequency domain. The field gradient during the alternating RF excitation and data acquisition provides frequency encoding. In standard SWIFT sequences, the gradient, G, and bandwidth, $B_w$, are constant, and projections of the spin density can be obtained using the previously described correlation methods. In GM-SWIFT, however, G and $B_w$ are time dependent. As a result, spins excited at different times experience differing segments of the time-varying gradient and, therefore, accumulate phase in a spatially and temporally dependent manner. As a result, the conventional correlation procedure used in standard SWIFT for unscrambling the phase does not remove these additional phase variations and, therefore, a different correlation procedure should be implemented.

Although magnitude of the gradient used in GM-SWIFT is time-varying during excitation, the magnetic gradient field direction remains invariant in order to frequency encode a one-dimensional projection of the object. As a result, the time-varying gradient moves a planar region of resonance along a straight trajectory. The spatial dependence of the k-space data in GM-SWIFT is therefore linear, as in a conventional MRI sequence, but has a unique temporal dependence related to the time-varying magnetic gradient field.

Figure 1A:
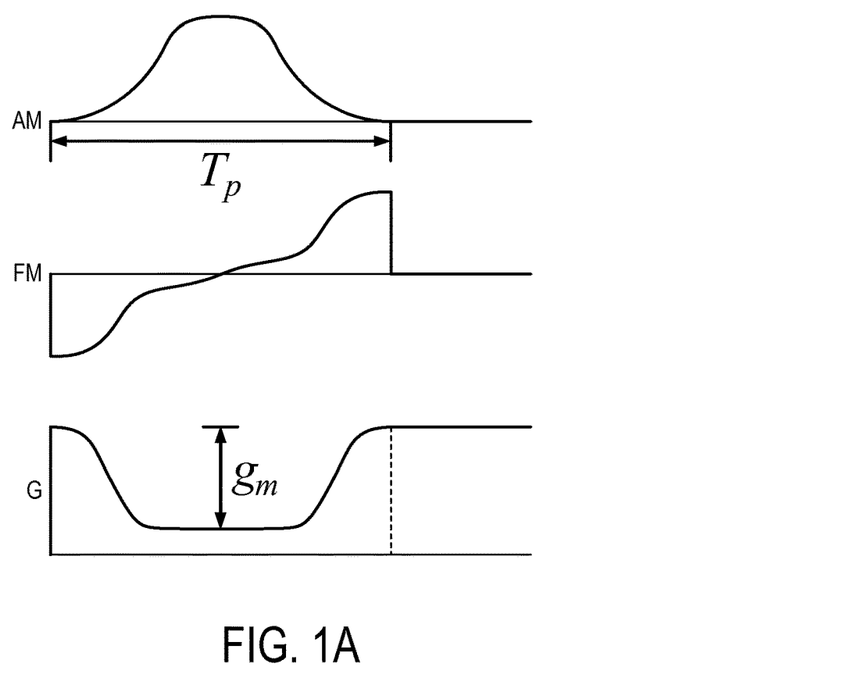
FIG. 1A is an example of a pulse sequence that may be used when implementing a gradient-modulated sweep imaging with Fourier transformation acquisition.
Figure 1B:
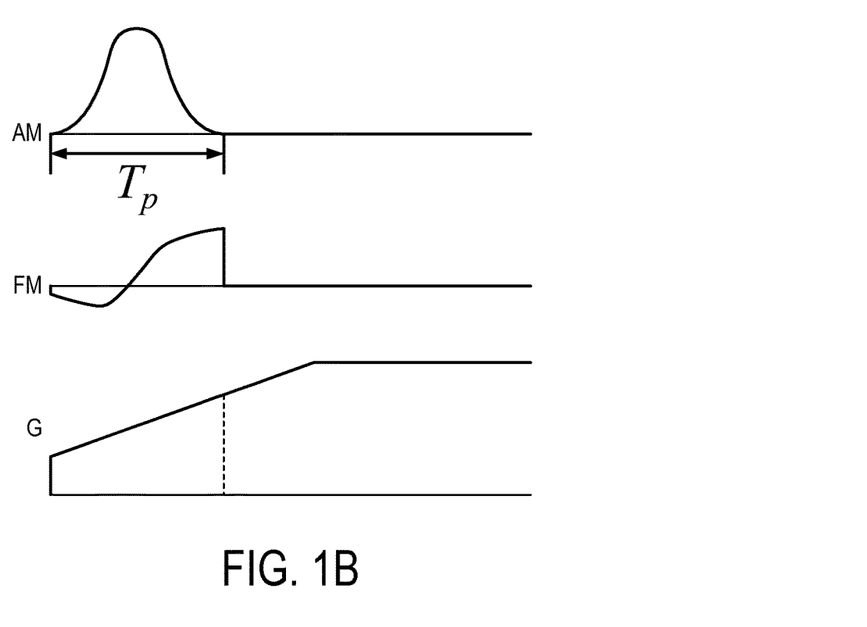
FIG. 1B is an example of another pulse sequence that may be used when implementing a gradient-modulated sweep imaging with Fourier transformation acquisition.

Examples of pulse sequence that include a gradient-modulated frequency swept excitation are illustrated in FIGS. 1A and 1B. In some embodiments, the pulse sequence includes a frequency swept excitation composed of a series of pulses, each pulse including excitation segments and quiescent segments. In alternative embodiments, however, the transmitter and receiver may be decoupled and quiescent segments may not be used. The RF excitation is delivered while a time-varying gradient is applied.

In some embodiments, the RF pulses may be of the family of hyperbolic secant ("HSn") pulses, which utilize both amplitude and frequency modulation. In some implementations, the RF pulses are run at a linear or sub-adiabatic range. A transition may be made from the adiabatic to the linear region by reducing the RF amplitude or increasing the sweep rate, while other pulse parameters remain constant.

The relationship between a continuous HSn pulse and a time-shared variant is analogous to the relationship between a long pulse of constant amplitude and a DANTE pulse train that closely approximates the excitation profile of the continuous pulse, but produces excitation sidebands at multiples of the pulse repetition rate. Because the repetition rate of the pulse elements and the acquisition rate may be equal to the inverse dwell time, the first excitation sideband is generally set outside of the acquisition spectral window. The offset frequencies may be created by incrementing the phases of pulse elements.

As will now be described, to overcome the limitations imposed on SWIFT by power deposition and SAR concerns, a time-varying magnetic field gradient can be applied during the sweeping frequency excitation. Preferably, the time-varying magnetic field gradient is applied in a constant direction during the frequency-swept RF excitation. Because a constant gradient direction is utilized during each repetition time ("TR"), the GM-SWIFT method employs a radial projection acquisition. Thus, in each successive TR, the direction of the gradient can be changed to sample a different projection along the object.

In some embodiments, gradient modulation can be achieved using a gradient modulated offset independent adiabaticity ("GOIA") approach, which transforms the RF amplitude or frequency modulation accordingly with the gradient modulation, while keeping a constant adiabaticity factor over the entire spectral bandwidth. In some other embodiments, other types of gradient modulation, such as a variable-rate selective excitation ("VERSE") implementation can also be applied to modify the RF pattern with required flat excitation profile. The VERSE method is described, for example, by S. Conolly, et al., in "Variable-Rate Selective Excitation," *Journal of Magnetic Resonance*, 1988; 78:440-458.

In the case of the SWIFT acquisition sequence, using gradient modulation to reduce power deposition is not trivial because the gradient modulation will influence both the excitation and the evolution of the spins. As a consequence, the regular correlation procedure used in SWIFT will not be able to resolve the scrambled phase of the spins accumulated during the changing field gradients.

As one example, a GOIA approach can be used to modify the pattern of the RF pulse. According to the GOIA approach, for given RF amplitude modulation, $F_1(t)$, and the gradient modulation, $G(t)$, the frequency modulation function $F_2(t)$ can be solved from the identity, $$\frac{d}{dt}\left(\frac{F_2(t)}{G(t)}\right) = \frac{2\pi(\gamma B_1^0 F_1(t))^2}{KAG(t)}; \quad (1)$$

by keeping the adiabatic factor, K, as a constant over the time. Here, $B_1^0$ is the amplitude of the RF amplitude modulation function; A, is the amplitude of the frequency modulation function; and $\gamma$ is the gyromagnetic ratio. The gradient modulation function, $G(t)$, can be any kind of function without zero points and not linearly proportional to $F_2(t)$. As an example, FIG. 1A schematically represents a GOIA-SWIFT implementation with frequency modulation calculated using Eqn. (1) for the chosen hyperbolic secant ("HS")-type gradient modulation function, $$G(t) = 1 - g_m \cdot \mathrm{sech}\left(\beta\left(\frac{2t}{T_p} - 1\right)^{n_p}\right); \quad (2)$$

where $n_P$ is a constant, $g_m$ is the gradient modulation factor, $T_p$ is pulse length, and $\beta$ is a truncation factor. As one example, $\beta$ can be equal to 7.6 to truncate the RF amplitude modulation, $F_1$, at 0.001 value. An HS-shaped gradient-modulation function can be advantageously used because of its smoothness and the continuity of its derivatives; however, it will be readily appreciated by those skilled in the art that other gradient-modulation functions can also be suitably used.

In the generation of a GOIA pulse, in Eqn. (1) an adiabaticity factor, K, was used. Although in a SWIFT sequence the pulse is in a sub-adiabatic condition, using an adiabaticity principle helps to find an optimal pulse producing a flat excitation profile. The value of the adiabaticity factor can be adjusted to allow the frequency sweep given by $AF_2(t)$, described below in Eqn. (4), such that it falls in the interval $[-A, A]$.

As mentioned above, data acquisition in GM-SWIFT includes acquiring a time domain signal. Signal acquisition can be done nearly simultaneously with excitation. Specifically, signal acquisition may be done during quiescent segments of a pulse. In accordance with the Nyquist theorem, sampling in the frequency versus time domain places a lower limit on the sweep rate used the frequency swept method, but places no upper limit on the sweep rate. The lack of an upper limit on the sweep rate is especially advantageous for MRI applications. In alternative embodiments, signal acquisition may be simultaneous with excitation.

Signal acquisition may be done in any suitable manner, for example using a receiver to measure current, voltage, impedance, or other parameter, as is know in the art. Following the excitation time, the ensuing magnetization evolution resembles a free-induction decay ("FID"). To obtain the spin spectrum, correlation, described below, may be used to remove the influence of the RF excitation function and to unscramble the phases of different spin isochromats having different excitation times.

As previously discussed, in some embodiments the frequency swept excitation include a series of pulses, each having an excitation segment and a quiescent segment. In these embodiments, data acquisition (or data sampling) is performed during the quiescent segments, after the excitation pulse segment. Because excitation is temporarily suspended during the quiescent segment, acquisition may be performed without acquiring the RF pulse. Thus, the frequency sweep is broken into excitation segments and quiescent segments wherein acquisition is performed during the quiescent segments and, thus, during the frequency sweep. This is referred to as time-shared excitation and signal acquisition. In some embodiments, signal acquisition may start before the quiescent segment or extend beyond the quiescent segment. In alternative embodiments, acquisition may be performed simultaneously with excitation by decoupling the transmitter and transceiver, thereby avoiding acquisition of the RF pulse.

The time-shared excitation and signal acquisition is preferably performed in the presence of an applied, time-varying magnetic field gradient, such as those described above. The magnetic field gradient can be used to select a region for imaging and also to encode the location of MR signals received from an object being imaged.

In one embodiment, acquisition is done radially. Every spectrum that is taken by applying a gradient gives one projection of the object: a projection of the object to gradient direction. To reconstruct an image of the object, the object is viewed from different angles. Thus, to create an image, it may be desirable to sample points along a predefined set of angles in a hemisphere or sphere. Generally, each point viewed may be equidistant from another point such that the sampling is isotropic.

To extract useful information from the spin system response, post processing is done to correct the acquired signal. Post processing may be done, for example, using a correlation method or a convolution method. As will be described, correlation generally includes Fourier transforming the excitation signal and the acquired time domain signal and processing the FT signals in the frequency domain, while accounting for the gradient modulation present during excitation and data acquisition. Deconvolution includes processing the excitation signal and the acquired time domain signal in the time domain and Fourier transforming the processed signals, while accounting for the gradient modulation present during excitation and data acquisition.

As described above, in GM-SWIFT, spins that are excited at different times will evolve during different values of a time-varying gradient and, as a result, will accumulate phase in different ways. This differential phase accrual prevents the use of the correlation procedure used in conventional SWIFT. Instead, a new correlation procedure is required to unscramble the phase.

Like standard SWIFT, GM-SWIFT pulse is also operating in the sub-adiabatic region, which is known as a rapid passage, linear region. In this region, flip angles are small and a spin system can be treated as a linear system. Using the small flip angle approximation, the signal evolution for a single spin isochromat at a position, x, at a time, $\tau$, $M_{xy}(x, \tau)$, can be derived by solving the Bloch equations in the rotating frame:

$$M_{xy}(x, \tau) = i\gamma M_0 \int_0^\tau B_1(t) e^{-i\gamma x \cdot \int_t^\tau G(t')dt'} dt; \quad (3)$$

where $$B_1(t) = B_1^0 F_1(t) e^{-i\int AF_2(t)dt} \quad (4);$$

is the modulation function of the RF pulse and G(t) is the modulation function of the magnetic field gradient. The gradient modulation function can be represented as a vector, $G(t) = G(t)\hat{G}$, and thus can specify both the magnitude and direction of the field gradient. It can be assumed that this solution for a continuous $B_1$ field is also suitable for gapped excitation, such as where the RF excitation includes a series of pulses, each having an excitation segment and a quiescent segment. The integral of transverse magnetization, $M_{xy}$ (x, τ), over all spins at different positions gives the total signal response of the entire object, $$r(\tau) = i\gamma M_0 \int_x \left\{ \rho_0(x) \int_0^\tau B_1(t) e^{-i\gamma x \cdot \int_0^t G(t')dt'} dt \right\} dx; \quad (5)$$

where $\rho_0(x)$ is the spin density. Recovering the spin density from the acquired signal in an inverse problem. The excitation k-space concept, which is defined as the integral of the time-varying gradient over time, can be used here to solve and provide further insight into the problem. By defining the excitation k-space, k(t), the spatial frequency weighting function, w(k), and the spatial frequency sampling function, s(k), as follows, $$k(t) = \gamma \int_t^{T_p} G(t')dt'; \quad (6)$$

$$w(k(t)) = \frac{B_1(t)}{|\gamma G(t)|}; \quad (7)$$

and $$s(k, \tau) = \int_0^\tau \delta(k(t) - k) |\dot{k}(t)| dt; \quad (8)$$

the signal response can be rewritten as, $$r(k(\tau)) = i\gamma M_0 \int_x \left\{ \rho_0(x) \int_k w(k) s(k, \tau) e^{i\gamma x \cdot [k - k(\tau)]} dk \right\} dx. \quad (9)$$

Both the integral of x and k are over the whole domains in Eqn. (9) and where accordingly noted below. The integral in Eqn. (6) starts at t and not zero because spatial encoding does not commence until a spin isochromat has been excited, such as by a frequency-swept pulse. $T_p$ is the acquisition time in one repetition period. Note that the spatial frequency sampling function, s(k, τ), is also dependent on the acquisition time, τ. For most hardware designs, τ will be at equally spaced positions in the time domain, and s(k, τ) will map τ to corresponding sample positions in k-space. Both standard SWIFT and GM-SWIFT acquisitions are radial k-space sampling sequences using a projection method, thus an excitation k-space trajectory follows center-out spokes in three-dimensional spherical k-space. In some embodiments, the sampling function can be, $$s(k,\tau) = \text{Heav}(k(\tau) - k) \quad (10)$$

which is a Heaviside step function describing that signals are present only after a spin has been excited. After substituting this sampling function, s(k, τ), into Eqn. (9) and integrating over x, the signal response with respect to k becomes, $$r(k(\tau)) = i\gamma M_0 \int_k \{h(k(\tau) - k)\} w(k) dk; \quad (11)$$

where h is the impulse function, which can be given as, $$h(k(\tau) - k) = \text{Heav}(k(\tau) - k) \int_x \rho_0(x) e^{i\gamma x \cdot (k - k(\tau))} dx. \quad (12)$$

The signal response became the convolution of the term in the brace and w(k). The Fourier transform of r(k(t)) with respect to k then becomes, $$R(x) = H(x) \cdot W(x) \quad (13);$$

where, $$H(x) = \rho_0(x) \otimes FT\{\text{Heav}(t)\} \quad (14);$$

and $$W(x) = \int_k w(k(t)) e^{-i\gamma x \cdot k} dk = FT\{w(k(t))\}. \quad (15)$$

The signal response r(τ) acquired with a uniform sampling interval in the time domain τ should be resampled to uniformly sample in the domain of k(τ). Then, a discrete Fourier transform can be used to reconstruct an image of the underlying object or subject. The same can be done for w(k(t)). The spectrum of the spin system, as shown in (14), which is also the Fourier transform of the product of the impulse function multiplied by the Heaviside function, can be retrieved by, $$H(x) = \frac{R(x) \cdot W^*(x)}{|W(x)|^2}. \quad (16)$$

In a full set of radial data, for each projection that is acquired, another projection is acquired with an opposite gradient direction. In this instance, the Heaviside function will become a constant and the real spin density, $\rho_0(x)$, can be retrieved.

The generalized correlation step can also be treated as a time retransformation or variable substitution, in which the k-space is transformed to a special time-modulated frame. In this case, the gradient appears "constant" and $B_1$ should be transformed into an effective $B_1$ in this frame. Then, the properties of linear response theory, as used for the time-independent system or standard SWIFT case, can be applied in this special time-modulated frame.

Thus, in some embodiments, to reconstruct an image of an underlying object or subject imaged using a GM-SWIFT technique the following general steps are performed. First, it may be assumed that during the frequency sweep a spin isochromat with resonance frequency, $f_0$, achieves resonance at a time, t, that is determined by the frequency-modulation function. This isochromat evolves "freely," with changing magnetic field gradient, in the transverse plane after the time, t, when it was excited. The signal response for GM-SWIFT can be derived as described above. Reconstruction then proceeds following transform of the RF pulse and time domain signal. The spin density, H(x), can be separated out finally.

The processing discussed above is based on treatment of the acquired signal as time domain signal. However, the excitation sweep is a function of both time and frequency and thus may be treated in either of the time domain or the frequency domain. In some embodiments, two spectra may be generated: one created by processing the signal as a time domain signal and one by processing the signal as a frequency domain signal. The two spectra have the same energy of noises, but different phases of noises. Thus, sensitivity of the magnetic resonance technique may be enhanced by averaging the two spectra.

Computer simulations based on the classical Bloch equations can help to reveal the behavior of spins during the application of gradient-modulated SWIFT imaging as taught herein.

Numerical simulations of gradient modulation, such as that in FIG. 1A, were done based on the Bloch equations. The simulated object was composed of 1,000 isochromats distributed evenly over a field-of-view. To avoid side band problems, the gapped RF pulse was oversampled to 16, with 2048 points and 256 gaps. The numbers of sampled signal and gradient points are 1024 and 256, respectively. The frequency modulations of RF pulse were calculated according to Eqn. (1) for a given FAO and G(t).

The first set of simulations was done with $n_p=4$, $g_m=0$, 0.7, 0.8 and 0.9 as in Eqn. (2) at the same RF power level. Reconstructed profiles were compared for $g_m$ equals to zero (SWIFT) and nonzero (GM-SWIFT) cases. Two different reconstruction conditions, conventional correlation on standard SWIFT data and new correlation on GM-SWIFT data were compared. The power spectrums of pulses used in these simulations were also calculated to show the energy distribution in frequency domain.

Figure 2:
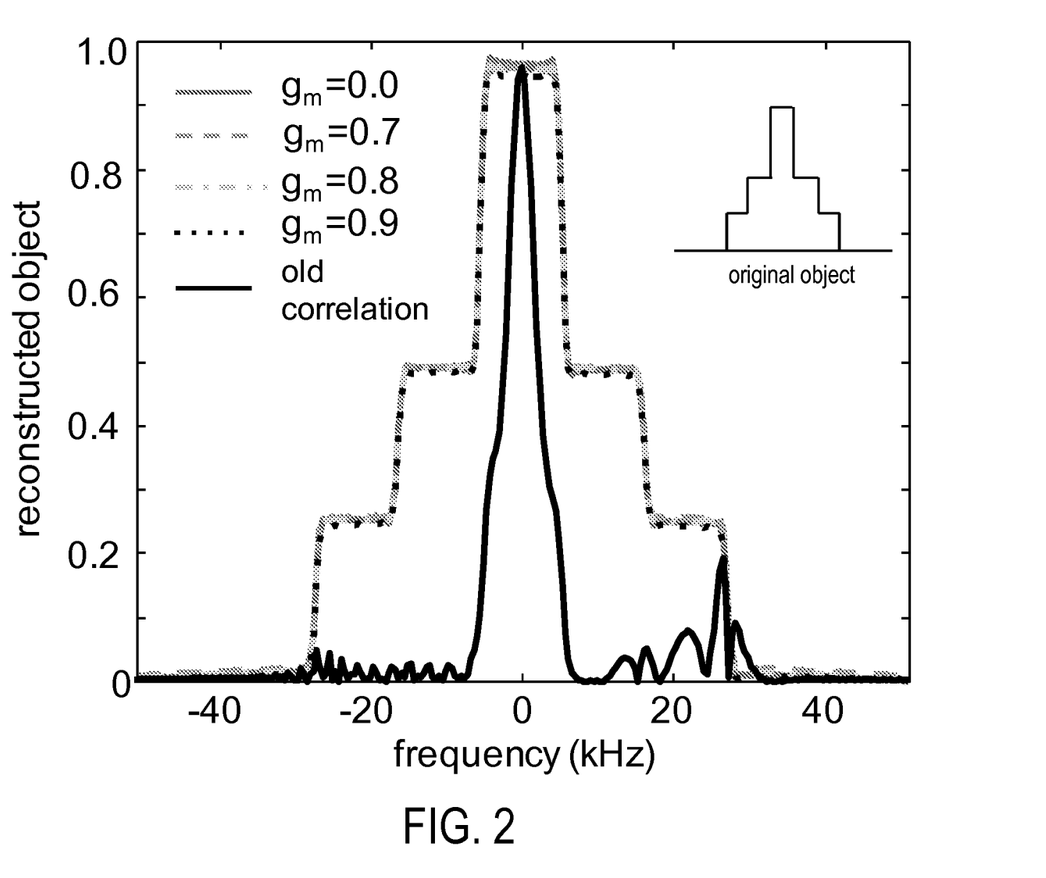
FIG. 2 is a plot illustrating the relationship between degree of gradient modulation and reconstructed image fidelity, and also illustrates the lack of faithful reconstruction provided by applying a conventional SWIFT correlation to gradient-modulated data.

When using the correlation technique described above, which accounts for gradient-modulations, negligible difference was observed between images with no gradient modulation ($g_m=0$, standard SWIFT) and those acquired with gradient modulation (e.g., nonzero $g_m$ values), as illustrated in FIG. 2. When using the correlation technique for conventional SWIFT on data acquired using the gradient modulation of GM-SWIFT, however, the resultant image did not faithfully represent the underlying object, as seen by the solid black line in FIG. 2.

Figure 3:
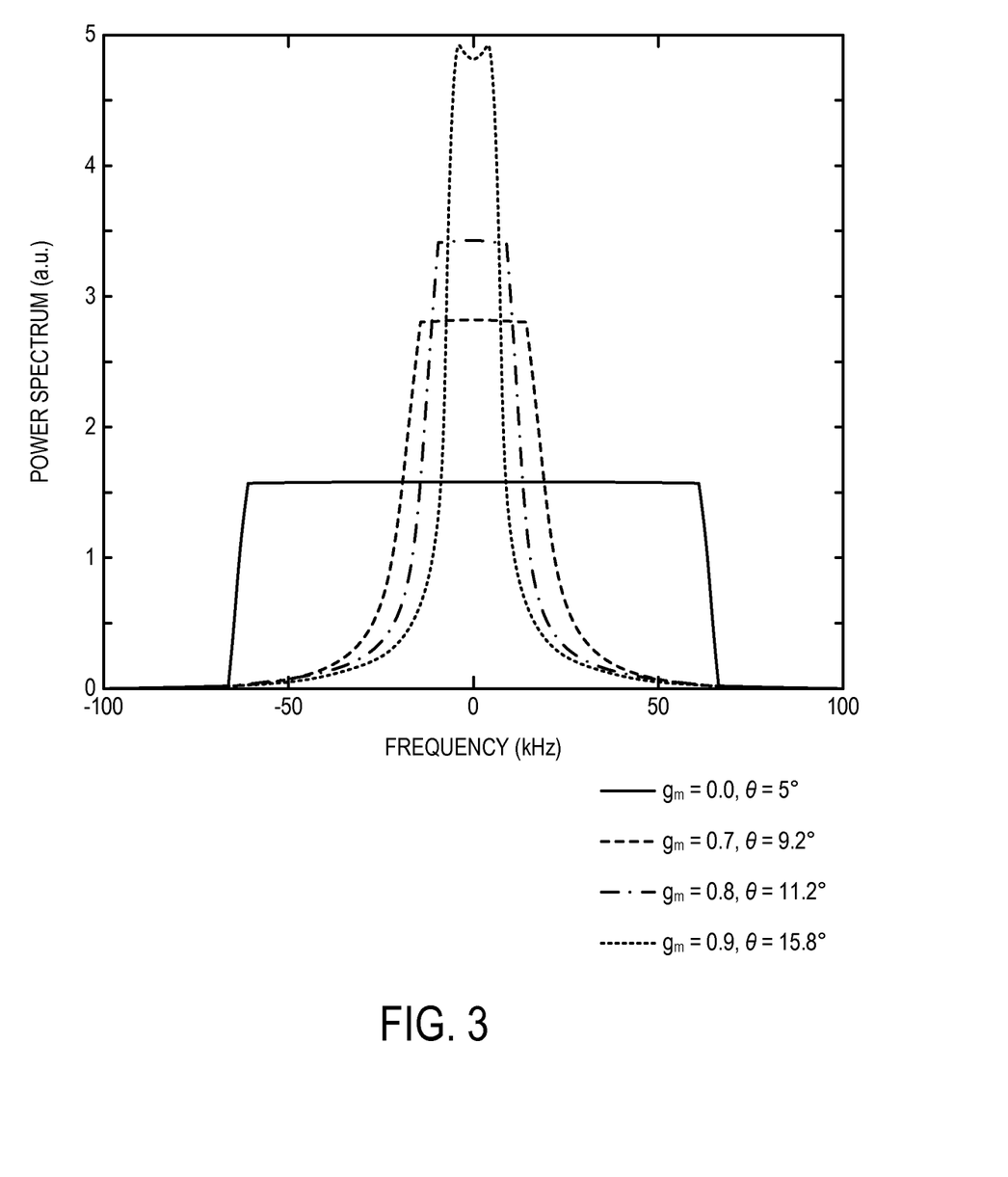
FIG. 3 is a plot illustrating the relationship between gradient modulation and power deposition.
Figure 4:
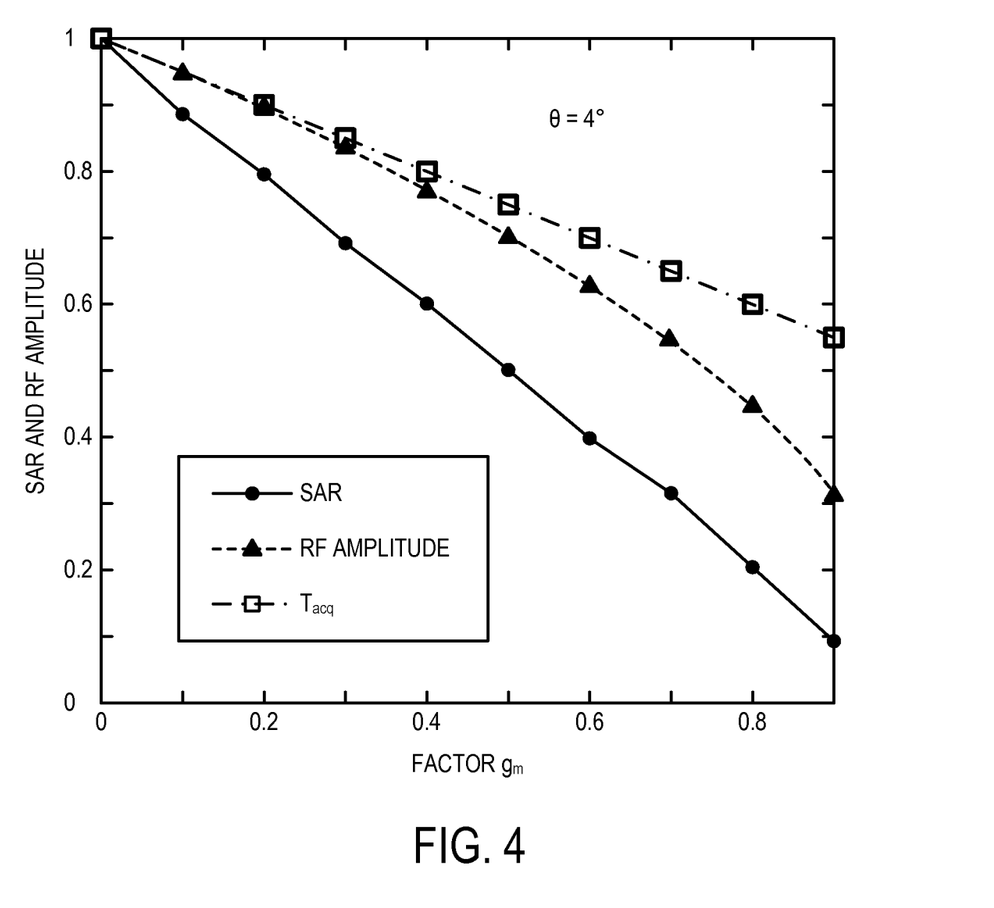
FIG. 4 is a plot illustrating the relationship between gradient modulation and specific absorption rate, RF amplitude, and acquisition time.

The power spectrum in FIG. 3 shows that the power was distributed uniformly across the pulse excitation bandwidth in $g_m=0$ case. As $g_m$ increases, more power is concentrated in the center frequency area, where most spins were excited. This explains how the gradient-modulation approach can save RF power. The relation between modulation factor, $g_m$; SAR; acquisition time; and RF amplitude is shown in FIG. 4. RF amplitude, SAR, and acquisition time $T_{acq}$ all decrease as $g_m$ increases, while other sequence parameters are held constant. When $g_m=0.9$, GM-SWIFT reduces RF amplitude, SAR, or $T_{acq}$ by 70%, 90%, and 45%, respectively, as compared to standard SWIFT. Due to the higher RF power efficiency, GM-SWIFT allows smaller $T_p$ for fixed flip angle and RF amplitude, which leads to reduced acquisition time for a given resolution.

The signal acquired in a SWIFT acquisition is contaminated by the RF pulse and thus needs the correlation step to resolve the resonating signal from the RF pulse signal. As mentioned above, additional processing is generally needed in the correlation procedures for GM-SWIFT because, in the case when the field gradient is time-varying, the original correlation procedure may not be applicable. The changing gradient has an influence on the time at which a spin is excited and the signal evolution of that spin after excitation. The accumulated phase of a given spin is not only dependent on the time interval during which it evolves, but also on the specific time point at which it is excited. Because the excitation phase is mixed together with the acquisition phase in the SWIFT scheme, the concept of excitation k-space as defined above is a useful tool for dealing with this phase problem.

The ability of GM-SWIFT to reduce SAR is beneficial for many types of experiments. In most conditions, SWIFT image without magnetization preparation is a proton density-weighted acquisition, mixing with $T_1$-weighting. At high field strengths, or when large volume and usually power-inefficient RF coils are used, creating certain $T_1$-constrast requires high flip angles, which are sometimes limited by hardware or SAR. GM-SWIFT thus provides a technique to overcome these SAR limitations of conventional SWIFT. Also, for imaging of fast relaxing spins, high excitation bandwidth is required, but sometimes restricted by SAR. GM-SWIFT can thus reduce SAR, overcome peak power limitations of the hardware, and achieve certain image contrasts that may otherwise be unable to obtain with conventional SWIFT imaging.

GM-SWIFT is able to achieve comparable image quality as standard SWIFT, even with a gradient modulation factor down to 0.9; although, the ability to resolve ultra-short $T_2^*$ signals reduced and depends on gradient modulation factor $g_m$. However, GM-SWIFT actually gets some benefits from the new sensitive range. SWIFT with constant gradient at high bandwidth is able to capture signal with $T_2^*$ as short as several microseconds. Conventional SWIFT sees everything, including some plastic or nylon material commonly used in coil building; however, due to the bandwidth limitation, these signals can't be resolved. This creates a halo over the whole image. With large gradient modulations, GM-SWIFT is less sensitive to spins with extremely short $T_2^*$, and as result, generates images with cleaner background. At same time, GM-SWIFT still keeps the ability to resolve spins with $T_2^*$ longer than 200 µs at the expense of some loss of image resolution.

The latter occurs in GM-SWIFT with HS-shaped gradient modulation because the fast decaying spins experience the low bandwidth portion of the GOIA pulse immediately after excitation. As compared to the constant gradient condition, some k-space information is lost in this process and this causes reduced sharpness in images of ultra-fast relaxing spins. Although most demonstrations described above utilized high gradient modulation factor ($g_m=0.8$ or 0.9), GM-SWIFT can also work with a medium or small $g_m$ value. In practice, by increasing $g_m$ just enough to satisfy SAR, peak RF amplitude, $T_1$-weighting requirements, or combinations thereof, the undesirable effects due to an increased $T_2^*$-sensitivity can be minimized.

In addition to reducing SAR, peak RF amplitude, and acquisition time over standard SWIFT, GM-SWIFT provides other flexibilities. For example, besides the HS-shape described above, other gradient modulation shapes (e.g., a linearly increasing function) can be used in GM-SWIFT for other purposes, such as increasing the bandwidth of the acquisition period after the RF pulse. It is contemplated that the generalized correlation procedures introduced here will be suitable for other types of gradient modulation as well.

Of note, in the limit $g_m \rightarrow 1$, GM-SWIFT resembles UTE. However, the gradient in UTE always starts from zero amplitude, whereas GM-SWIFT offers flexibility to operate with an optimal $g_m$ value (i.e., the minimum value) that satisfies some practical constraints (e.g., SAR, tolerated sound level, and unresolved background signal suppression), while minimizing image blur and SNR loss for short T$_2$* spins. As compared with UTE, the requirement to rapidly switch between transmit and receive modes is more stringent with SWIFT, and this currently limits its achievable bandwidth. However, GM-SWIFT reduces the bandwidth during excitation, which makes an increased switching time permissible, like in UTE. Hence, it is contemplated that GM-SWIFT will be easier than SWIFT to implement on clinical scanners, which cannot switch rapidly between transmit and receive modes.

GM-SWIFT is sensitive to the gradient performance. As a result, the gradients should preferably be calibrated to make sure the gradient timing error in different directions is smaller than several microseconds. A global delay in all directions can be compensated in the correlation step, but different delays in each direction will introduce bright/dark line artifacts at the edge of an object.

In summary, GM-SWIFT can achieve reduction of SAR, RF amplitude or acquisition time, and provides control over the T$_2$ sensitive range for producing a clean background in images. The tradeoff is some reduction in the sharpness of short T$_2$* spins, depending on the level of gradient modulation. By manipulating the gradient, GM-SWIFT can maximize the efficiency of RF power and provide a way to find the optimal settings that balance RF amplitude, SAR, scan time, and image quality considerations. It offers a bridge between UTE or ZTE type sequences and SWIFT type sequences.

Figure 5:
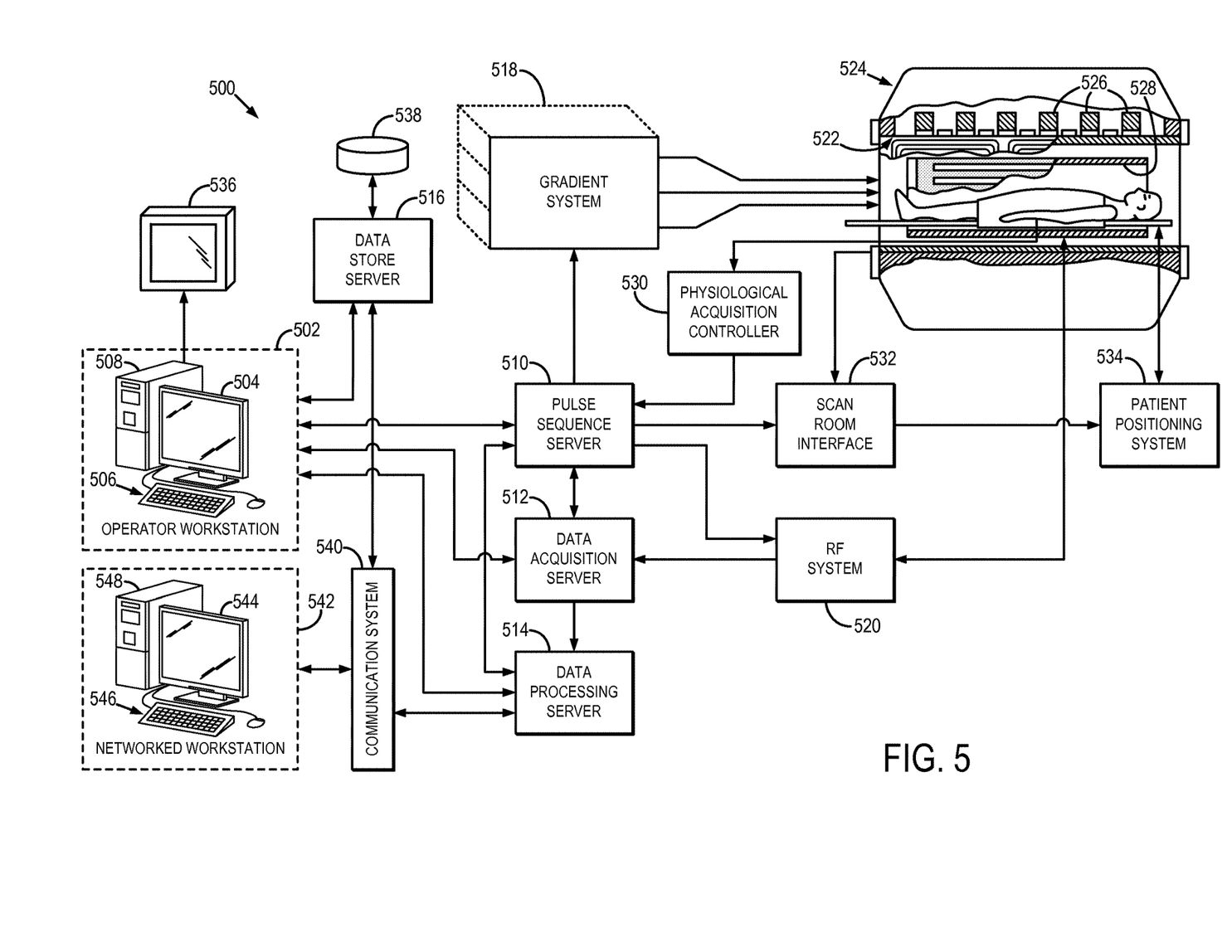
FIG. 5 is a block diagram of an example of a magnetic resonance imaging ("MRI") system.

Referring particularly now to FIG. 5, an example of a magnetic resonance imaging ("MRI") system 500 that may implement some embodiments of the systems and methods described above is illustrated. The MRI system 500 includes an operator workstation 502, which will typically include a display 504; one or more input devices 506, such as a keyboard and mouse; and a processor 508. The processor 508 may include a commercially available programmable machine running a commercially available operating system. The operator workstation 502 provides the operator interface that enables scan prescriptions to be entered into the MRI system 500. In general, the operator workstation 502 may be coupled to four servers: a pulse sequence server 510; a data acquisition server 512; a data processing server 514; and a data store server 516. The operator workstation 502 and each server 510, 512, 514, and 516 are connected to communicate with each other. For example, the servers 510, 512, 514, and 516 may be connected via a communication system 540, which may include any suitable network connection, whether wired, wireless, or a combination of both. As an example, the communication system 540 may include both proprietary or dedicated networks, as well as open networks, such as the internet.

The pulse sequence server 510 functions in response to instructions downloaded from the operator workstation 502 to operate a gradient system 518 and a radiofrequency ("RF") system 520. Gradient waveforms necessary to perform the prescribed scan are produced and applied to the gradient system 518, which excites gradient coils in an assembly 522 to produce the magnetic field gradients G$_x$, G$_y$, and G$_z$ used for position encoding magnetic resonance signals, or for establishing the gradient modulations described above. The gradient coil assembly 522 forms part of a magnet assembly 524 that includes a polarizing magnet 526 and a whole-body RF coil 528.

RF waveforms are applied by the RF system 520 to the RF coil 528, or a separate local coil (not shown in FIG. 5), in order to perform the prescribed pulse sequence. Responsive magnetic resonance signals detected by the RF coil 528, or a separate local coil (not shown in FIG. 5), are received by the RF system 520, where they may be amplified, demodulated, filtered, and digitized under direction of commands produced by the pulse sequence server 510. The RF system 520 includes an RF transmitter for producing a wide variety of RF pulses used in MRI pulse sequences, such as the frequency swept RF excitations described above. The RF transmitter is responsive to the scan prescription and direction from the pulse sequence server 510 to produce RF pulses of the desired frequency, phase, and pulse amplitude waveform. The generated RF pulses may be applied to the whole-body RF coil 528 or to one or more local coils or coil arrays (not shown in FIG. 5). The RF system 520 also includes one or more RF receiver channels. Each RF receiver channel may include an RF preamplifier that amplifies the magnetic resonance signal received by the coil 528 to which it is connected.

The pulse sequence server 510 may optionally receive patient data from a physiological acquisition controller 530. By way of example, the physiological acquisition controller 530 may receive signals from a number of different sensors connected to the patient, such as electrocardiograph ("ECG") signals from electrodes, or respiratory signals from a respiratory bellows or other respiratory monitoring device. Such signals are typically used by the pulse sequence server 510 to synchronize, or "gate," the performance of the scan with the subject's heart beat or respiration.

The pulse sequence server 510 also connects to a scan room interface circuit 532 that receives signals from various sensors associated with the condition of the patient and the magnet system. It is also through the scan room interface circuit 532 that a patient positioning system 534 receives commands to move the patient to desired positions during the scan.

The digitized magnetic resonance signal samples produced by the RF system 520 are received by the data acquisition server 512. The data acquisition server 512 operates in response to instructions downloaded from the operator workstation 502 to receive the real-time magnetic resonance data and provide buffer storage, such that no data is lost by data overrun. In some scans, the data acquisition server 512 does little more than pass the acquired magnetic resonance data to the data processor server 514. However, in scans that require information derived from acquired magnetic resonance data to control the further performance of the scan, the data acquisition server 512 is programmed to produce such information and convey it to the pulse sequence server 510. For example, during prescans, magnetic resonance data is acquired and used to calibrate the pulse sequence performed by the pulse sequence server 510. As another example, navigator signals may be acquired and used to adjust the operating parameters of the RF system 520 or the gradient system 518, or to control the view order in which k-space is sampled.

The data processing server 514 receives magnetic resonance data from the data acquisition server 512 and processes it in accordance with instructions downloaded from the operator workstation 502. Such processing may, for example, the correlation or deconvolution processing described above, as well one or more of the following: reconstructing two-dimensional or three-dimensional images by performing a Fourier transformation of raw k-space data; performing other image reconstruction algorithms, such as iterative or backprojection reconstruction algorithms; applying filters to raw k-space data or to reconstructed images; generating functional magnetic resonance images; calculating motion or flow images; and so on.

Images reconstructed by the data processing server 514 are conveyed back to the operator workstation 502 where they are stored. Real-time images are stored in a data base memory cache (not shown in FIG. 5), from which they may be output to operator display 512 or a display 536 that is located near the magnet assembly 524 for use by attending physicians. Batch mode images or selected real time images are stored in a host database on disc storage 538. When such images have been reconstructed and transferred to storage, the data processing server 514 notifies the data store server 516 on the operator workstation 502. The operator workstation 502 may be used by an operator to archive the images, produce films, or send the images via a network to other facilities.

The MRI system 500 may also include one or more networked workstations 542. By way of example, a networked workstation 542 may include a display 544; one or more input devices 546, such as a keyboard and mouse; and a processor 548. The networked workstation 542 may be located within the same facility as the operator workstation 502, or in a different facility, such as a different healthcare institution or clinic.

The networked workstation 542, whether within the same facility or in a different facility as the operator workstation 502, may gain remote access to the data processing server 514 or data store server 516 via the communication system 540. Accordingly, multiple networked workstations 542 may have access to the data processing server 514 and the data store server 516. In this manner, magnetic resonance data, reconstructed images, or other data may exchanged between the data processing server 514 or the data store server 516 and the networked workstations 542, such that the data or images may be remotely processed by a networked workstation 542. This data may be exchanged in any suitable format, such as in accordance with the transmission control protocol ("TCP"), the internet protocol ("IP"), or other known or suitable protocols.

The present invention has been described in terms of one or more preferred embodiments, and it should be appreciated that many equivalents, alternatives, variations, and modifications, aside from those expressly stated, are possible and within the scope of the invention.

The invention claimed is:

1. A method for producing an image of a subject with a magnetic resonance imaging (MRI) system, the steps of the method comprising:
    directing the MRI system to perform a pulse sequence that includes:
        applying a sweeping frequency excitation having a duration, the sweeping frequency excitation being configured to sequentially excite spins having different resonance frequencies;
        applying a time-varying magnetic field gradient in a constant direction during the duration when the sweeping frequency excitation is applied, the time-varying magnetic field being configured to impart a different phase accumulation to spins having different resonance frequencies;
        acquiring a time domain signal during the duration when the time-varying magnetic field gradient is being applied, the time domain signal being based on evolution of the spins; and
    generating data for display from the acquired time domain signal;
    wherein generating data for display includes a reconstructing an image from the acquired time domain signal based on a correlation of a Fourier transform of the applied sweeping frequency excitation weighted by the time-varying magnetic field gradient and a Fourier transform of the time domain signal.

2. The method as recited in claim 1, wherein the time domain signal is rescaled based on modulations provided by the applied time-varying magnetic field gradient, and reconstructing the image comprises reconstructing the image from the rescaled time domain signal.

3. The method as recited in claim 2, wherein reconstructing the image includes generating a spectrum based on a correlation of a Fourier transform of the applied sweeping frequency excitation weighted by the time-varying magnetic field gradient and a Fourier transform of the rescaled time domain signal.

4. The method as recited in claim 3, further comprising computing a spatial weighting function based on the sweeping frequency excitation and a modulation provided by the time-varying magnetic field, and wherein the spectrum is generated based on a correlation of a Fourier transform of the spatial weighting function and the Fourier transform of the rescaled time domain signal.

5. The method as recited in claim 1, wherein applying the sweeping frequency excitation comprises applying a frequency modulation.

6. The method as recited in claim 5, wherein the frequency modulation is based on a selected radio frequency amplitude modulation and a modulation provided by the time-varying magnetic field gradient.

7. The method as recited in claim 1, wherein applying the sweeping frequency excitation comprises applying a sweeping frequency excitation using a transmitter and wherein acquiring the time domain signal comprises detecting the signal on a receiver.

8. The method as recited in claim 7, wherein the transmitter and receiver are decoupled.

9. The method as recited in claim 1, wherein the time domain signal is based on evolution of magnetization of the spins.

10. The method as recited in claim 1, wherein the sweeping frequency excitation includes applying a plurality of discrete radio frequency excitation pulses and wherein acquiring the time domain signal includes sampling between the radio frequency excitation pulses.

11. The method as recited in claim 1, further comprising selecting the sweeping RF excitation and the time-varying magnetic field gradient using a gradient modulated offset independent adiabaticity (GOIA) technique.

12. The method as recited in claim 1, further comprising selecting the sweeping RF excitation and the time-varying magnetic field gradient using a variable-rate selective excitation (VERSE) technique.

13. The method as recited in claim 1, wherein the time-varying magnetic field gradient varies linearly as a function of time.

14. The method as recited in claim 1, wherein the time-varying magnetic field gradient varies non-linearly as a function of time.

* * * * *

UNITED STATES PATENT AND TRADEMARK OFFICE
CERTIFICATE OF CORRECTION

PATENT NO. : 10,698,053 B2
APPLICATION NO. : 14/617616
DATED : June 30, 2020
INVENTOR(S) : Jinjin Zhang et al.

Page 1 of 2

It is certified that error appears in the above-identified patent and that said Letters Patent is hereby corrected as shown below:

In the Specification

Column 6, Eq. (3), " $M_{xy}(x,\tau) = i\gamma M_0 \int_0^\tau B_1(t) e^{-i\gamma x \cdot \int_t^\tau G(t')dt'} dt$ " should be
-- $M_{xy}(x,\tau) = i\gamma M_0 \int_0^\tau B_1(t) e^{-i\gamma x \cdot \int_t^\tau G(t')dt'} dt$ --.

Column 7, Eq. (5), " $r(\tau) = i\gamma M_0 \int_x \left\{ \rho_0(x) \int_0^\tau B_1(t) e^{-i\gamma \cdot \int_0^\tau G(t')dt} dt \right\} dx$ " should be
-- $r(\tau) = i\gamma M_0 \int_x \left\{ \rho_0(x) \int_0^\tau B_1(t) e^{-i\gamma \cdot \int_0^\tau G(t')dt'} dt \right\} dx$ --.

Column 7, Eq. (6), " $k(t) = \gamma \int_t^{T_p} G(t')dt'$ " should be -- $k(t) = \gamma \int_t^T G(t')dt'$ --.

Column 7, Eq. (8), " $s(k,\tau) = \int_0^\tau \delta(k(t)-k)|\dot{k}(t)|dt$ " should be -- $s(k,\tau) = \int_0^\tau \delta(k(t)-k)|\dot{k}(t)|dt$ --.

Column 7, Eq. (9), " $r(k(\tau)) = i\gamma M_0 \int_x \left\{ \rho_0(x) \int_k w(k)s(k,\tau)e^{i\gamma x \cdot [k-k(\tau)]} dk \right\} dx$ " should be Signed and Sealed this
Eleventh Day of May, 2021

Drew Hirshfeld
*Performing the Functions and Duties of the*
*Under Secretary of Commerce for Intellectual Property and*
*Director of the United States Patent and Trademark Office*

CERTIFICATE OF CORRECTION (continued)
U.S. Pat. No. 10,698,053 B2

$$r(k(\tau)) = i\gamma M_0 \int_x \left\{ \rho_o(x) \int_k w(k) s(k,\tau) e^{i\gamma x \cdot [k-k(\tau)]} dk \right\} dx$$

Column 8, Eq. (12), " $h(k(\tau)-k) = Heav(k(\tau)-k) \int_x \rho_0(x) e^{i\gamma x(k-k(\tau))} dx$ " should be $$h(k(\tau)-k) = Heav(k(\tau)-k) \int_x \rho_0(x) e^{i\gamma x(k-k(\tau))} dx$$

--.

Column 8, Eq. (15), " $W(x) = \int_k w(k(t)) e^{-i\gamma x \cdot k} dk = FT\{w(k(t))\}$ " should be $$W(x) = \int_k w(k(t)) e^{-i\gamma x \cdot k} dk = FT\{w(k(t))\}$$

--.

Column 9, Line 24, "FAO" should be --$F_1(t)$--.

In the Claims

Column 14, Lines 3-4, "includes a reconstructing an image" should be --includes reconstructing an image--.